United States Patent
Ueda et al.

(10) Patent No.: US 9,989,605 B2
(45) Date of Patent: Jun. 5, 2018

(54) MAGNETIC RESONANCE IMAGING APPARATUS

(71) Applicant: TOSHIBA MEDICAL SYSTEMS CORPORATION, Otawara-shi (JP)

(72) Inventors: Yu Ueda, Tochigi (JP); Hiromitsu Takamori, Tochigi (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 701 days.

(21) Appl. No.: 14/532,512

(22) Filed: Nov. 4, 2014

(65) Prior Publication Data

US 2015/0145516 A1 May 28, 2015

(30) Foreign Application Priority Data

Nov. 22, 2013 (JP) ................................. 2013-242321

(51) Int. Cl.
  *G01R 33/38* (2006.01)
  *G01R 33/385* (2006.01)
  *G01R 33/3873* (2006.01)

(52) U.S. Cl.
  CPC ...... *G01R 33/3854* (2013.01); *G01R 33/3873* (2013.01)

(58) Field of Classification Search
  CPC ................ G01R 33/3854; G01R 33/28; G01R 33/34046; G01R 33/38; G01R 33/3858; A61B 5/0555
  See application file for complete search history.

(56) References Cited

U.S. PATENT DOCUMENTS 6,437,568 B1 * 8/2002 Edelstein ........... G01R 33/3854
                                                  324/309
7,906,967 B2 * 3/2011 Katsunuma ........ G01R 33/3854
                                                  324/318

(Continued)

FOREIGN PATENT DOCUMENTS

| JP | 10-118043 | 5/1998 |
| JP | 2005-066320 | 3/2005 |
| JP | 2009-022640 | 2/2009 |

OTHER PUBLICATIONS

Blaylock Gasket and Packing.*

*Primary Examiner* — Clayton E Laballe
*Assistant Examiner* — Ruifeng Pu
(74) *Attorney, Agent, or Firm* — Nixon & Vanderhye P.C.

(57) ABSTRACT

A magnetic resonance imaging apparatus includes: a magnetostatic field magnet formed in the shape of a substantially circular cylinder; a gradient coil formed in the shape of a substantially circular cylinder on the inside of the magnetostatic field magnet; a cylindrical part that is formed in the shape of a substantially circular cylinder on the inside of the gradient coil and includes at least one selected from a sound absorbing material layer and a sound blocking material layer; and a ring part that is substantially ring-shaped, covers the space formed between the magnetostatic field magnet and the cylindrical part on at least one end face of a magnet structure being formed in the shape of a substantially circular cylinder and including the magnetostatic field magnet, the gradient coil, and the cylindrical part, and includes at least one selected from an sound absorbing material layer and a sound blocking material layer.

19 Claims, 14 Drawing Sheets

(56) References Cited

U.S. PATENT DOCUMENTS

| | | | | |
|---|---|---|---|---|
| 2004/0178792 A1* | 9/2004 | Edelstein | ........... | G01R 33/3854 |
| | | | | 324/318 |
| 2005/0040825 A1* | 2/2005 | Sellers | ............... | G01R 33/3854 |
| | | | | 324/318 |
| 2008/0094062 A1* | 4/2008 | Edelstein | ........... | G01R 33/4215 |
| | | | | 324/318 |
| 2010/0225321 A1* | 9/2010 | Kruip | ................. | G01R 33/3854 |
| | | | | 324/318 |
| 2012/0313643 A1* | 12/2012 | Edelstein | ........... | G01R 33/3854 |
| | | | | 324/318 |
| 2013/0234709 A1* | 9/2013 | Hierl | ...................... | G01R 33/28 |
| | | | | 324/318 |
| 2013/0234711 A1* | 9/2013 | Dietz | ...................... | G01R 33/38 |
| | | | | 324/319 |
| 2013/0234712 A1* | 9/2013 | Dietz | ...................... | G01R 33/28 |
| | | | | 324/319 |
| 2013/0234713 A1* | 9/2013 | Maciejewski | .... | G01R 33/34007 |
| | | | | 324/321 |
| 2013/0314089 A1* | 11/2013 | Katsunuma | ........ | G01R 33/3854 |
| | | | | 324/322 |
| 2013/0338488 A1* | 12/2013 | Dietz | .................. | A61B 5/0555 |
| | | | | 600/415 |

\* cited by examiner

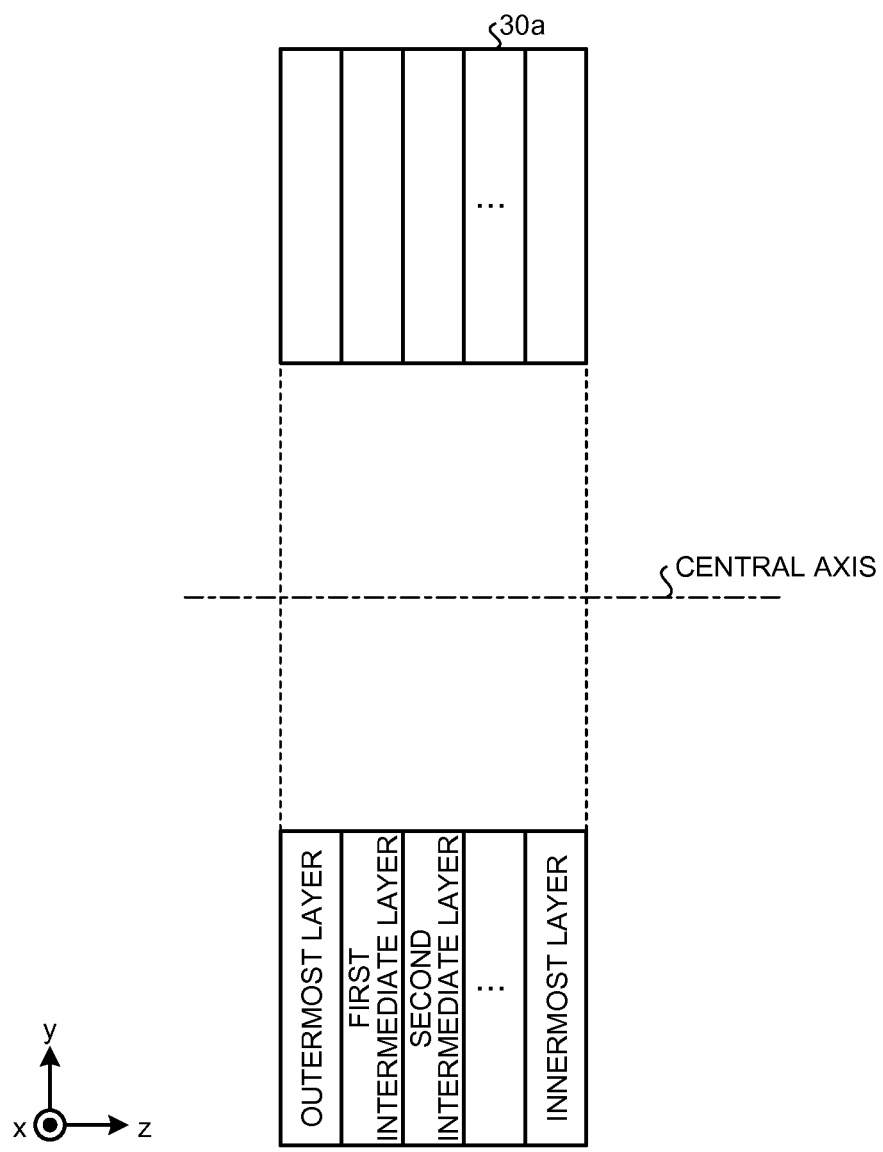

MAGNETIC RESONANCE IMAGING APPARATUS

CROSS-REFERENCE TO RELATED APPLICATIONS

This application is based upon and claims the benefit of priority from Japanese Patent Application No. 2013-242321, filed on Nov. 22, 2013; the entire contents of which are incorporated herein by reference.

FIELD

Embodiments described herein relate generally to a magnetic resonance imaging apparatus.

BACKGROUND

Conventionally, as a countermeasure for the noise generated during an image taking process performed by a magnetic resonance imaging apparatus, a noise reduction technique has been known by which the amount of sound that propagates to the vicinity of the ears of the patient (the examined subject) is reduced by bringing the surroundings of the gradient coil, which is the source of the generated sound, into a vacuum state. As an example of such a noise reduction technique, a method is known by which the gradient coil is disposed in a hermetically-sealed container so as to arrange the space inside the hermetically-sealed container to be in a vacuum state.

BRIEF DESCRIPTION OF THE DRAWINGS

FIG. 8 is a drawing for explaining another exemplary structure of the ring part according to the first embodiment;

DETAILED DESCRIPTION

A magnetic resonance imaging apparatus according to an embodiment includes a magnetostatic field magnet, a gradient coil, a cylindrical part, and a ring part. The magnetostatic field magnet is formed in the shape of a substantially circular cylinder. The gradient coil is formed in the shape of a substantially circular cylinder on the inside of the magnetostatic field magnet. The cylindrical part is formed in the shape of a substantially circular cylinder on the inside of the gradient coil and includes at least one selected from: a layer made of a sound absorbing material that absorbs sound; and a layer made of a sound blocking material that blocks sound. The ring part is substantially ring-shaped, is configured to cover the space formed between the magnetostatic field magnet and the cylindrical part on at least one end face of a magnet structure being formed in the shape of a substantially circular cylinder and including the magnetostatic field magnet, the gradient coil, and the cylindrical part, and includes at least one selected from: a layer made of the sound absorbing material; and a layer made of the sound blocking material.

Exemplary embodiments of a magnetic resonance imaging apparatus will be explained below, with reference to the accompanying drawings.

First Embodiment

Figure 1:
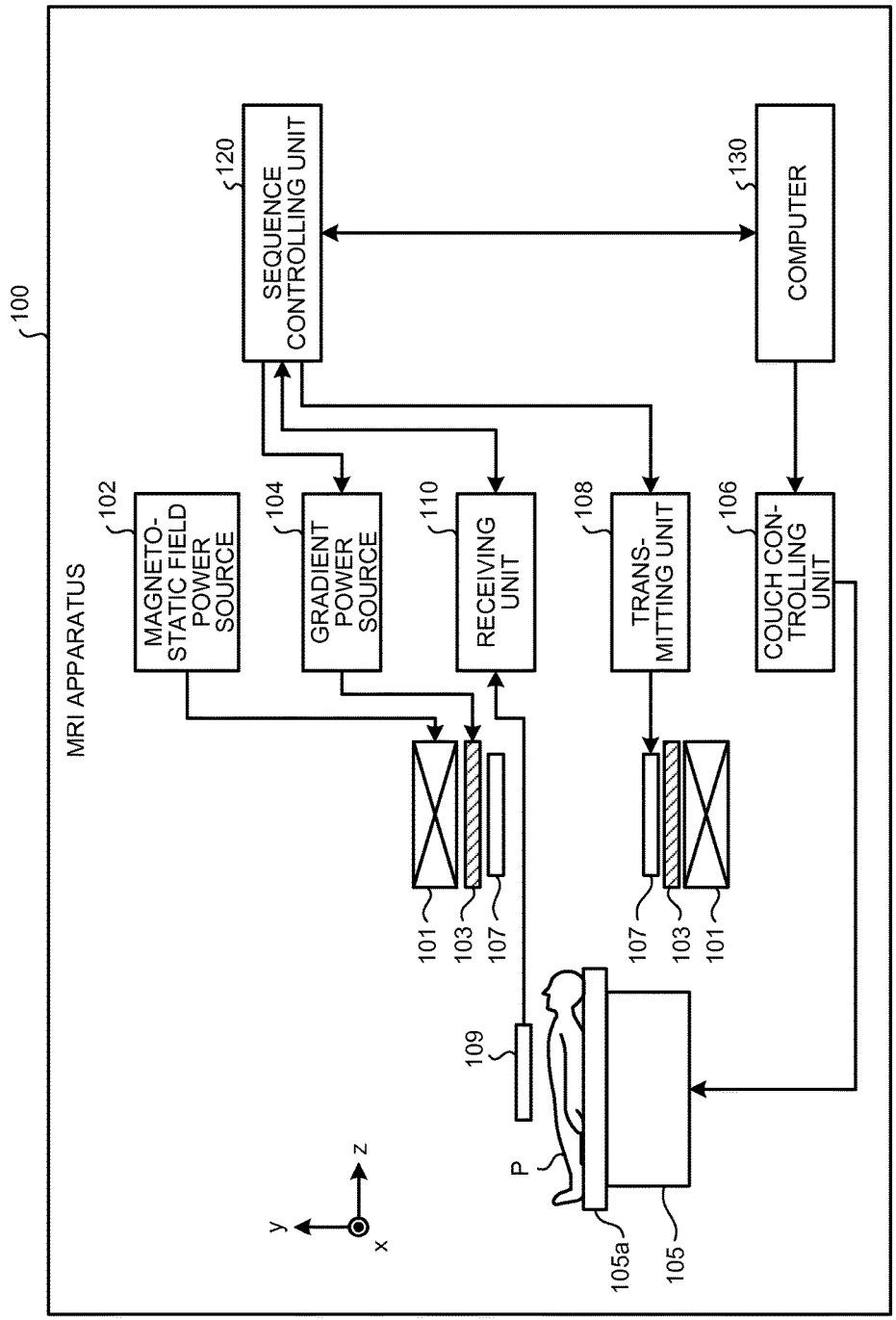
FIG. 1 is a functional block diagram of a Magnetic Resonance Imaging (MRI) apparatus according to a first embodiment.

FIG. 1 is a functional block diagram of a Magnetic Resonance Imaging (MRI) apparatus 100 according to a first embodiment. In the following sections, magnetic resonance imaging apparatuses will be referred to as MRI apparatuses.

As shown in FIG. 1, the MRI apparatus 100 includes a magnetostatic field magnet 101, a magnetostatic field power source 102, a gradient coil 103, a gradient power source 104, a couch 105, a couch controlling unit 106, a whole body (WB) coil 107, a transmitting unit 108, a local coil 109, a receiving unit 110, a sequence controlling unit 120, and a computer 130. The MRI apparatus 100 does not include an examined subject (such as a human body; hereinafter, "patient") P. The configuration illustrated in FIG. 1 is merely an example.

The magnetostatic field magnet 101 is a magnet formed in the shape of a substantially hollow circular cylinder and is configured to generate a magnetostatic field in the space on the inside thereof. The magnetostatic field magnet 101 may be configured by using, for example, a superconductive magnet and is configured to be excited by receiving a supply of electric current from the magnetostatic field power source 102. The magnetostatic field power source 102 is configured to supply the electric current to the magnetostatic field magnet 101. Alternatively, the magnetostatic field magnet 101 may be configured by using a permanent magnet. In that situation, the MRI apparatus 100 does not need to include the magnetostatic field power source 102. Further, the magnetostatic field power source 102 may be provided separately from the MRI apparatus 100.

The gradient coil 103 is a coil formed in the shape of a substantially hollow circular cylinder and is disposed on the inside of the magnetostatic field magnet 101. The gradient coil 103 is formed by combining three coils corresponding to x-, y-, and z-axes that are orthogonal to one another. These three coils individually receive a supply of electric current from the gradient power source 104 and generate gradient magnetic fields of which the magnetic field intensities change along the x-, y-, and z-axes. The gradient magnetic fields on the x-, y-, and z-axes that are generated by the gradient coil 103 correspond to, for example, a slice encoding gradient magnetic field $G_{SE}$ (or a slice selecting gradient magnetic field $G_{SS}$), a phase encoding gradient magnetic field $G_{PE}$, and a frequency encoding gradient magnetic field $G_{RO}$, respectively. The gradient power source 104 supplies the electric current to the gradient coil 103.

The couch 105 includes a couchtop 105a on which the patient P is placed. Under control of the couch controlling unit 106, while the patient P is placed thereon, the couchtop 105a is inserted into the hollow (i.e., an image taking opening) of the gradient coil 103. Normally, the couch 105 is provided so that the longitudinal direction thereof extends parallel to the central axis of the magnetostatic field magnet 101. Under control of the computer 130, the couch controlling unit 106 is configured to drive the couch 105 so that the couchtop 105a moves in longitudinal directions and in up-and-down directions.

The WB coil 107 is provided on the inside of the gradient coil 103 and is configured to generate a radio frequency magnetic field by receiving a supply of a radio frequency (RF) pulse from the transmitting unit 108. Further, the WB coil 107 is configured to receive magnetic resonance signals (hereinafter, "MR signals", as necessary) emitted from the patient P due to an influence of the radio frequency magnetic field and to output the received MR signals to the receiving unit 110.

The transmitting unit 108 supplies the RF pulse corresponding to a Larmor frequency determined by the type of targeted atoms and the magnetic field intensities, to the WB coil 107.

The local coil 109 is disposed on the inside of the gradient coil 103 and is configured to receive the MR signals emitted from the patient P due to the influence of the radio frequency magnetic field. When having received the MR signals, the local coil 109 outputs the received MR signals to the receiving unit 110.

The WB coil 107 and the local coil 109 described above are merely examples. For example, the local coil 109 does not necessarily have to be provided. Further, the WB coil 107 and the local coil 109 may be configured by combining one or more selected from: a coil having only a transmitting function; a coil having only a receiving function; and a coil having a transmitting/receiving function.

The receiving unit 110 is configured to detect the MR signals output from the local coil 109 and to generate MR data on the basis of the detected MR signals. More specifically, the receiving unit 110 generates the MR data by applying a digital conversion to the MR signals output from the local coil 109. Further, the receiving unit 110 is configured to transmit the generated MR data to the sequence controlling unit 120. The receiving unit 110 may be provided on the gantry device side where the magnetostatic field magnet 101, the gradient coil 103, and the like are provided.

The sequence controlling unit 120 is configured to perform an image taking process on the patient P, by driving the gradient power source 104, the transmitting unit 108, and the receiving unit 110, on the basis of sequence information transmitted from the computer 130. In this situation, the sequence information is information that defines a procedure for performing the image taking process. The sequence information defines: the intensity of the electric current to be supplied to to the gradient coil 103 and the timing with which the electric current is to be supplied; the strength of the RF pulse to be supplied by the transmitting unit 108 to the WB coil 107 and the timing with which the RF pulse is to be applied; the timing with which the MR signals are to be detected by the receiving unit 110, and the like. For example, the sequence controlling unit 120 may be configured with an integrated circuit such as an Application Specific Integrated Circuit (ASIC) or a Field Programmable Gate Array (FPGA) or an electronic circuit such as a Central Processing Unit (CPU) or a Micro Processing Unit (MPU).

Further, when having received MR signal data from the receiving unit 110 as a result of the image taking process performed on the patient P by controlling the gradient power source 104, the transmitting unit 108, and the receiving unit 110, the sequence controlling unit 120 transfers the received MR signal data to the computer 130.

The computer 130 is configured to exercise overall control of the MRI apparatus 100, to generate an MR image, and the like. For example, on the basis of an image taking condition input by an operator, the computer 130 causes the sequence controlling unit 120 to execute an image taking sequence. Further, on the basis of the MR signal data transmitted from the sequence controlling unit 120, the computer 130 reconstructs an image. The computer 130 may have the reconstructed image stored into a storage unit or displayed by a display unit. The computer 130 is configured with, for example, an information processing apparatus such as a computer apparatus.

The MRI apparatus 100 according to the first embodiment configured as described above includes, for the purpose of reducing noise caused by vibration of the gradient coil 103, a cylindrical part which is formed in the shape of a substantially circular cylinder on the inside of the gradient coil 103 and in which at least one layer made of a sound absorbing material that absorbs sound and at least one layer made of a sound blocking material that blocks sound are laminated. Thus, the MRI apparatus 100 is able to enhance noise reduction capability.

In the following sections, the MRI apparatus 100 according to the first embodiment will be explained. The "shape of a substantially circular cylinder" in the present example includes not only the shape of a circular cylinder, but also any cylindrical shape that is skewed (e.g., the cross section may be a perfect circle or may be oval) so long as the functions of the MRI apparatus 100 are not significantly affected.

Figure 2:
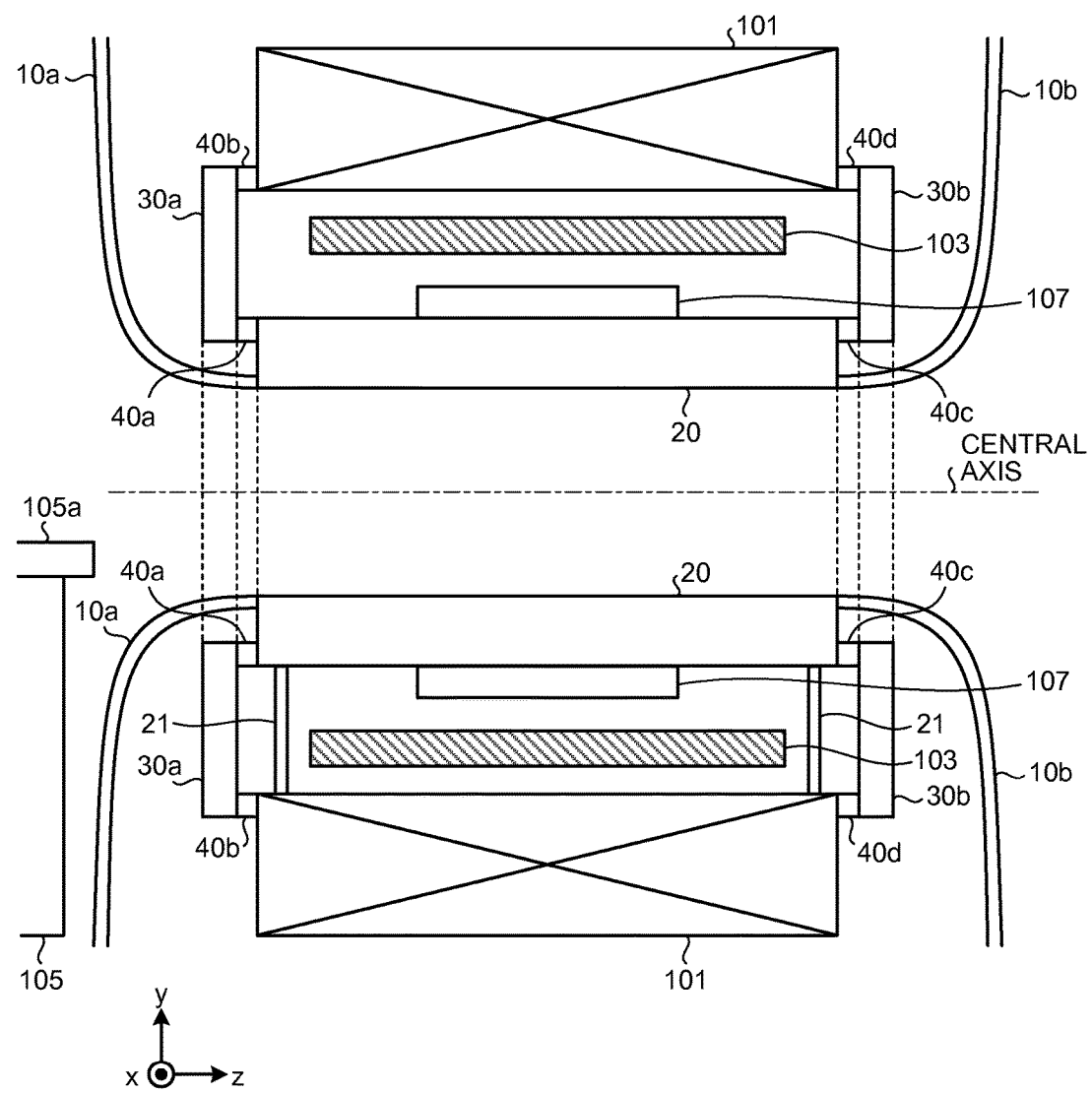
FIG. 2 is a drawing for explaining a structure on the inside of a circular cylinder of a magnetostatic field magnet according to the first embodiment.

FIG. 2 is a drawing for explaining a structure on the inside of the circular cylinder of the magnetostatic field magnet 101 according to the first embodiment. FIG. 2 illustrates a cross-sectional view on the y-z plane that passes through the central axis of the magnetostatic field magnet 101. In the first embodiment, along the central axis direction of the magnetostatic field magnet 101, the side positioned closer to the couch 105 is defined as the front side, whereas the side positioned farther from the couch 105 is defined as the rear side, while the center of the magnetic field is used as a reference point. Further, the magnetostatic field magnet 101, the gradient coil 103, and a cylindrical part 20 may collectively be referred to as a magnet structure.

As illustrated in FIG. 2, the end faces of the magnetostatic field magnet 101, the gradient coil 103, and the WB coil 107 on the front side are covered by a gantry cover 10a. The end faces of the same on the rear side are covered by a gantry cover 10b. Further, the MRI apparatus 100 includes the cylindrical part 20 which is formed in the shape of a substantially circular cylinder on the inside of the gradient coil 103 and in which at least one layer made of a sound absorbing material and at least one layer made of a sound blocking material are laminated. The cylindrical part 20 is supported by a cylindrical part supporting unit 21.

Further, the MRI apparatus 100 includes ring parts 30a and 30b each of which is substantially ring-shaped, which are configured to cover the space formed between the magnetostatic field magnet 101 and the cylindrical part 20 at the end faces of the magnet structure on the front side and on the rear side, respectively, and each of which includes at least one layer made of a sound blocking material.

Further, in the MRI apparatus 100, the ring part 30a has sealing members 40a and 40b provided along each of the inner and the outer circumferences of a plane that is in contact with the magnetostatic field magnet 101 and the cylindrical part 20. Further, in the MRI apparatus 100, the ring part 30b has sealing members 40c and 40d provided along each of the inner and the outer circumferences of a plane that is in contact with the magnetostatic field magnet 101 and the cylindrical part 20.

As explained above, by including the cylindrical part 20, a ring part 30, a sealing members 40, the MRI apparatus 100 is able to reduce the sound generated by the gradient coil 103. In the following sections, the cylindrical part 20, the ring part 30, and the sealing members 40 will sequentially be explained. Gantry covers that together cover the entirety of the gantry are configured with a plurality of gantry covers such as gantry covers 10a, 10b, and the like that cover different parts of the gantry. When it is not necessary to distinguish the gantry covers from one another, each of the gantry covers may generally be referred to as a "gantry cover 10". When it is not necessary to distinguish the ring parts 30a and 30b from one another, each of the ring parts 30a and 30b may generally be referred to as a "ring part 30". When it is not necessary to distinguish the sealing members 40a, 40b, 40c, and 40d from one another, each of the sealing members 40a, 40b, 40c, and 40d may generally be referred to as a "sealing member 40". In the following explanation, the gantry refers to the structure in which the magnetostatic field magnet 101, the gradient coil 103, and the WB coil 107 are covered by the gantry covers 10.

The Cylindrical Part 20

Figure 3A:
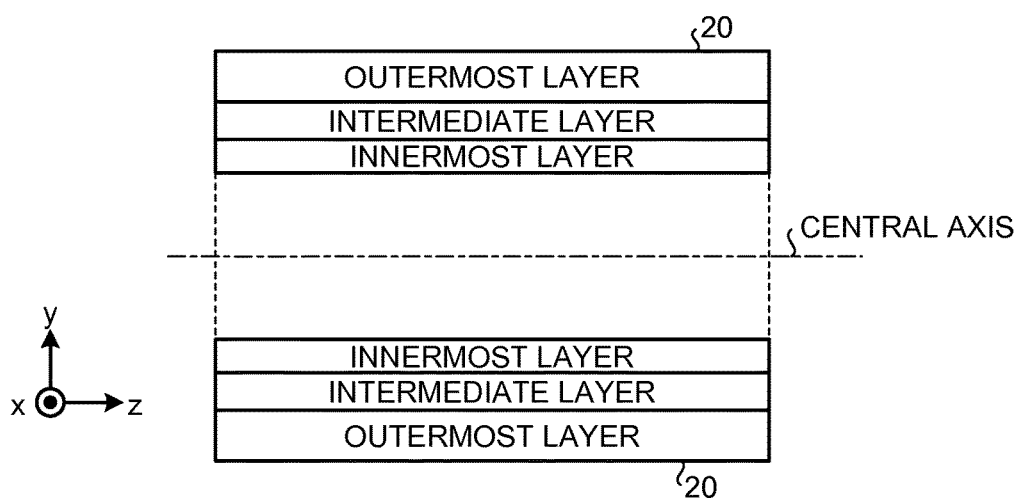
FIGS. 3A and 3B are drawings for explaining an exemplary structure of a cylindrical part according to the first embodiment.
Figure 3B:
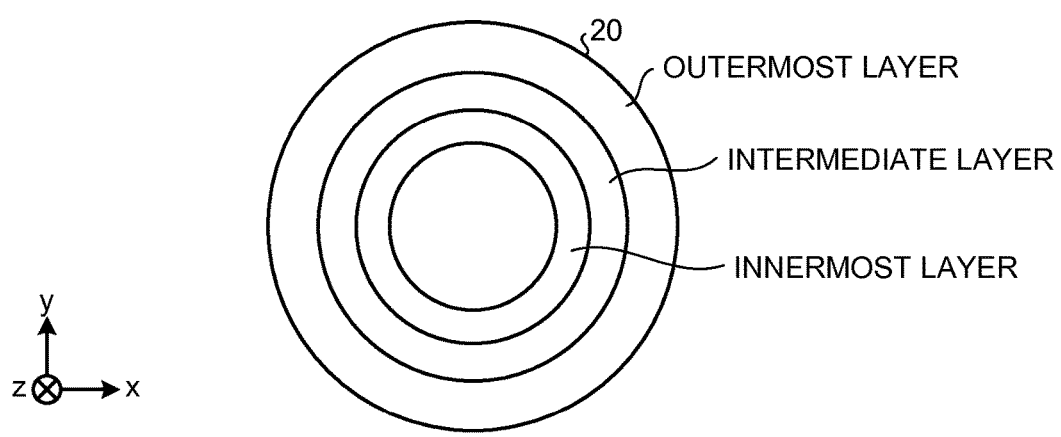

FIGS. 3A and 3B are drawings for explaining an exemplary structure of the cylindrical part 20 according to the first embodiment. FIG. 3A illustrates a cross-sectional view of the cylindrical part 20 on the y-z plane that passes through the central axis of the magnetostatic field magnet 101. FIG. 3B illustrates a cross-sectional view of the cylindrical part 20 on an x-y plane.

As illustrated in FIGS. 3A and 3B, for example, the cylindrical part 20 includes three layers that are, namely, an outermost layer, an intermediate layer, and an innermost layer. Of these layers, to achieve strength, the outermost layer is configured as a layer made of a sound blocking material by using, for example, thermosetting resin containing glass such as Glass-Fiber Reinforced Plastic (GFRP). The GFRP structure is manufactured by performing a Filament Winding (FW) shaping (molding) process, for example. By using the sound blocking material having a high surface density as the outermost layer of the cylindrical part 20 as described above, it is possible to effectively block the sound generated by the gradient coil 103.

Further, the intermediate layer is configured as a layer made of a sound absorbing material by using, for example, rubber sponge such as ethylene-propylene-diene (EPDM) rubber sponge. The EPDM structure is shaped by performing, for example, a metal molding process. By providing the layer made of the sound absorbing material on the inside of the layer made of the sound blocking material as described above, it is possible to effectively absorb the sound that propagates while using the sound blocking material as a medium. More specifically, although the GFRP used in the outermost layer blocks the sound generated by the gradient coil 103, the GFRP propagates a part of the sound (a solid propagation). For this reason, by providing the EPDM on the inside of the GFRP, it is possible to absorb the sound that propagates while using the GFRP as a medium.

Further, the innermost layer is configured as a layer made of a sound blocking material by using, for example, thermosetting resin containing glass such as GFRP. The GFRP structure is manufactured by performing, for example, hand lay-up molding process. By using the sound blocking material having a high surface density as the innermost layer of the cylindrical part 20 as described above, it is possible to effectively block the sound that propagates while using the sound absorbing material as a medium. More specifically, although the EPDM used in the intermediate layer absorbs the sound that propagates while using the outermost layer as a medium, the EPDM allows a part of the sound to pass into the inside of the circular cylinder (an airborne propagation). For this reason, by providing the GFRP on the inside of the EPDM (the intermediate layer), it is possible to block the sound that has passed through the EPDM.

Next, the thickness of each of the layers will be explained. For example, in order to keep the thickness of the entirety of the cylindrical part 20 small while maintaining a desired level of noise reduction capability, it is suggested that the thickness of the layer having the highest surface density be increased within the range permitted by the weight. For example, in the example illustrated in FIGS. 3A and 3B, it is suggested that the outermost layer be the thickest among the three layers. In contrast, in order to keep the weight of the entirety of the cylindrical part 20 light while maintaining a desired level of noise reduction capability, it is suggested that the thickness of the lightest layer be increased within the range permitted by the thickness. For example, in the example illustrated in FIGS. 3A and 3B, it is suggested that the intermediate layer be the thickest among the three layers. Possible embodiments are not limited to these examples. It is possible to arbitrarily change the thickness of each of the layers within the range that allows the desired level of noise reduction capability to be maintained.

Further, in the present example, the cylindrical part 20 includes, as the innermost layer, the non-metallic layer having a predetermined strength. For example, the cylindrical part 20 includes, as the innermost layer, the non-metallic layer having a strength required to function as the gantry cover 10. With this arrangement, the innermost layer of the cylindrical part 20 is able to serve also as the gantry cover 10.

As explained above, the cylindrical part 20 is configured so that one or more layers made of the sound blocking material and one or more layers made of the sound absorbing material are laminated so as to alternate, the layers each being a non-metallic layer. With this arrangement, for example, the cylindrical part 20 is able to prevent the sound generated by the gradient coil 103 from propagating to the inside of the cylindrical part 20.

Further, in the example illustrated in FIG. 2, the cylindrical part 20 is supported by the cylindrical part supporting unit 21 on the magnetostatic field magnet 101. Because the cylindrical part 20 is supported in this manner so as not to be in contact with the gradient coil 103, it is possible to prevent the sound generated by the gradient coil 103 from propagating through a solid propagation. It should be noted, however, that possible embodiments are not limited to this example. For instance, the cylindrical part 20 may be supported on a floor surface.

The description with reference to FIGS. 3A and 3B is merely an example. For instance, the cylindrical part 20 may be configured as illustrated in FIG. 4.

Figure 4:
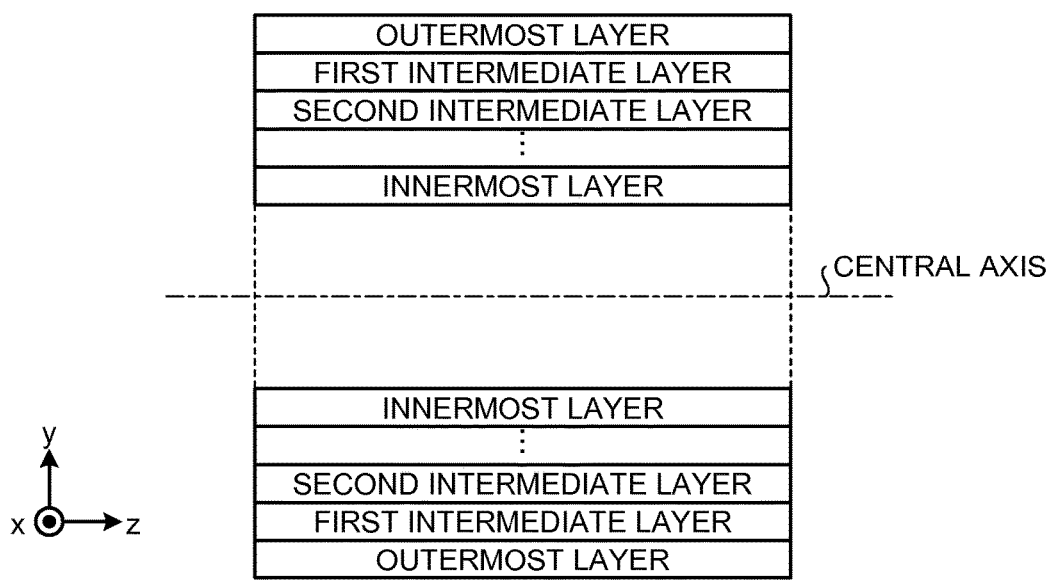
FIG. 4 is a drawing for explaining another exemplary structure of the cylindrical part according to the first embodiment.

FIG. 4 is a drawing for explaining another exemplary structure of the cylindrical part 20 according to the first embodiment. FIG. 4 illustrates a cross-sectional view of the cylindrical part 20 on the y-z plane that passes through the central axis of the magnetostatic field magnet 101.

As illustrated in FIG. 4, the cylindrical part 20 includes a plurality of layers such as an outermost layer, a first intermediate layer, a second intermediate layer, . . . , and an innermost layer. In this situation, it is desirable to configure the cylindrical part 20 in such a manner that layers made of a sound blocking material and layers made of a sound absorbing material are laminated so as to alternate. The reason is that it is possible to realize even a higher level of noise reduction capability, by repeating the sound absorption and the sound blocking, the sound absorption being realized with the layers made of the sound absorbing material to absorb the sound that propagates while using the layers made of the sound blocking material as a medium, and the sound blocking being realized with the layers made of the sound blocking material to block the sound that has passed through the layers made of the sound absorbing material.

Possible embodiments are not limited to the examples described above. The cylindrical part 20 does not necessarily have to be configured in such a manner that the layers made of the sound blocking material and the layers made of the sound absorbing material are laminated so as to alternate. For example, the cylindrical part 20 may be configured so that, in one or more parts thereof, layers made of a sound blocking material are laminated successively or layers made of a sound absorbing material are laminated successively. In other words, the cylindrical part 20 is configured so that at least one layer made of a sound absorbing material and at least one layer made of a sound blocking material are laminated.

Further, in the cylindrical part 20, thermosetting resin containing glass does not necessarily have to be used in the layer made of a sound blocking material. However, in order to achieve a predetermined strength, it is desirable to configure the cylindrical part 20 so as to include at least one layer made of thermosetting resin containing glass as a layer made of a sound blocking material. Further, for example, as the layer made of a sound blocking material, it is sufficient if the cylindrical part 20 includes a layer made of thermosetting resin such as Fiber-Reinforced Plastic (FRP). Further, in the cylindrical part 20, rubber sponge does not necessarily have to be used in the layer made of a sound absorbing material. For example, it is sufficient if the cylindrical part 20 includes either a rubber layer or a sponge layer, as the layer made of a sound absorbing material.

Further, the cylindrical part 20 may be configured so as to include two layers. For instance, the cylindrical part 20 may be configured so as to include a layer made of GFRP serving as a sound blocking material as the innermost layer and to include a layer made of EPDM serving as a sound absorbing material as the outermost layer.

Figure 5A:
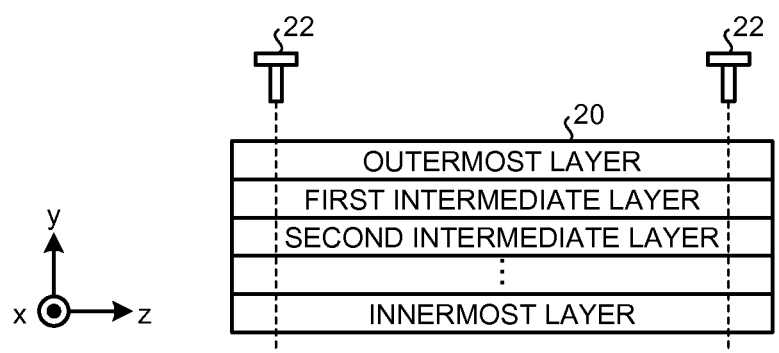
FIGS. 5A and 5B are drawings for explaining connections between layers in the cylindrical part according to the first embodiment.
Figure 5B:
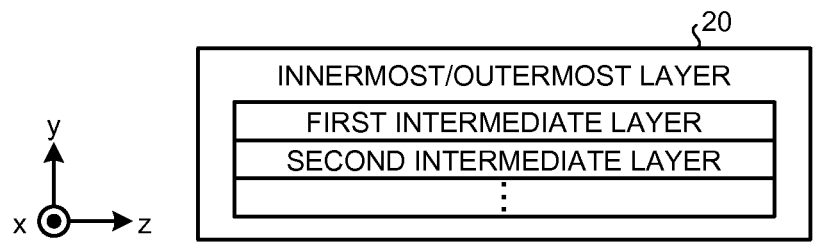

FIGS. 5A and 5B are drawings for explaining connections between the layers in the cylindrical part 20 according to the first embodiment. FIGS. 5A and 5B each illustrate a region above the central axis in a cross-sectional view of the cylindrical part 20 on the y-z plane that passes though the central axis of the magnetostatic field magnet 101.

For example, as illustrated in FIG. 5A, the layers in the cylindrical part 20 are connected to one another, as a result of fastening together the layers included in the cylindrical part 20. More specifically, the layers in the cylindrical part 20 are connected to one another, as a result of mechanically fastening together the layers from the outermost layer to the innermost layer by using fastening component parts 22 such as bolts. Even more specifically, the layers in the cylindrical part 20 are connected to one another as a result of fastening the upper part of the cylindrical part 20 on the front side and the rear side in one location each, by using the fastening component parts 22. The configuration illustrated in FIG. 5A is merely an example. For instance, it is possible to change the number of locations in which the layers are fastened to any arbitrary number as long as the layers are kept in alignment with one another. It is, however, preferable to fasten the layers in at least one location each on the front side and on the rear side of the cylindrical part 20.

Alternatively, as illustrated in FIG. 5B, for example, the layers in the cylindrical part 20 may be connected to one another, as a result of adhering together the layers included in the cylindrical part 20. More specifically, the layers in the cylindrical part 20 are connected to one another, as a result of performing a Resin Transfer Molding (RTM) process on the intermediate layers (the first intermediate layer, the second intermediate layer, and so on) by using thermoplastic resin. In that situation, the thermoplastic resin used in the RTM process forms an innermost/outermost layer that functions as both the outermost layer and the innermost layer. In that situation, as the intermediate layers, it is possible to use any arbitrary material selected out of the following materials that are also mentioned above: thermosetting resin containing glass, thermoplastic resin, rubber sponge, rugger, sponge, and the like. It should be noted that, however, when resin (thermosetting resin containing glass or thermoplastic resin) is used to form the intermediate layers, it is desirable to use resin that is a different material from the thermoplastic resin used in the molding process (of the innermost/outermost layer), for the purpose of varying the specific gravities between the innermost/outermost layer and the intermediate layers.

As explained above, the layers in the cylindrical part 20 are connected by one another, as a result of either adhering or fastening together the layers included in the cylindrical part 20.

Figure 6:
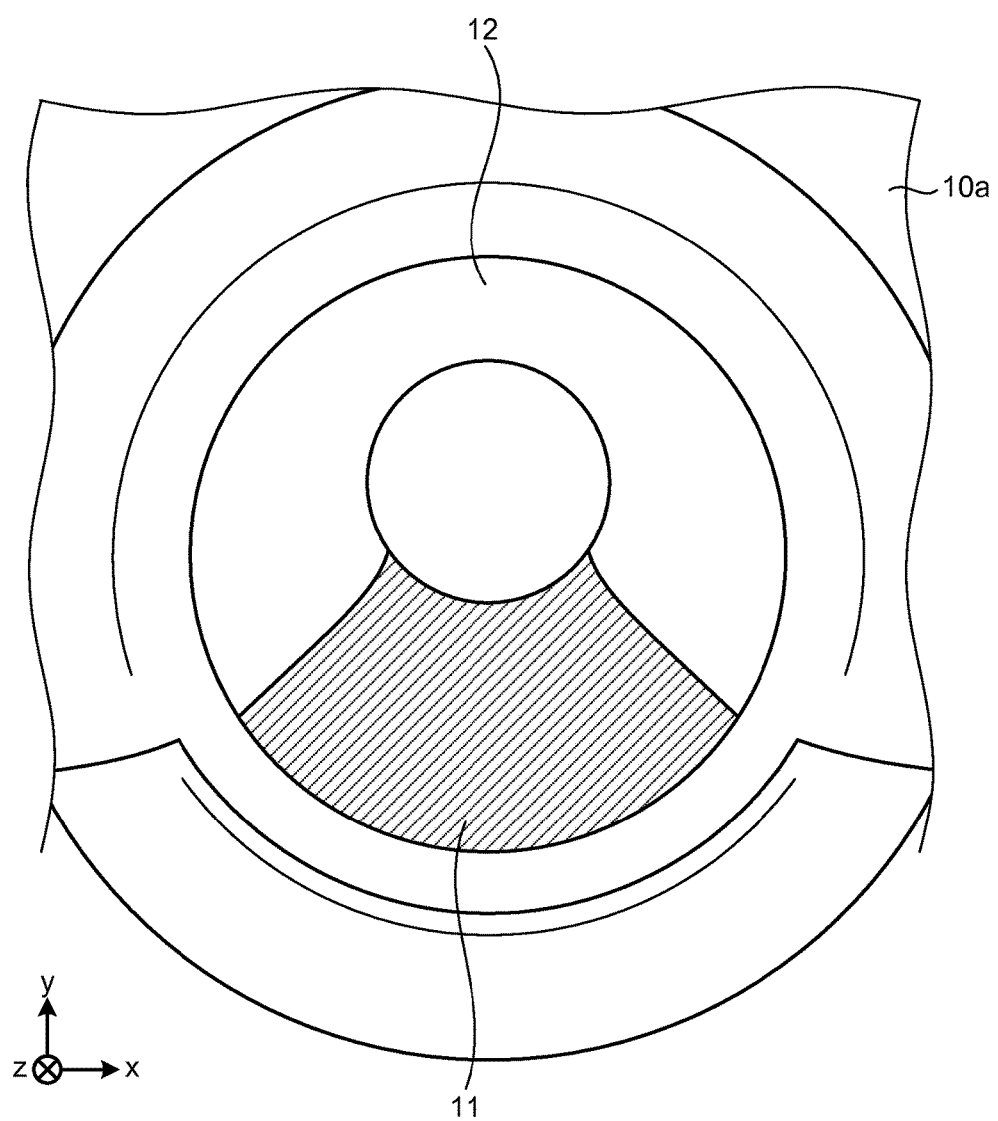
FIG. 6 is a drawing of an application example of the cylindrical part according to the first embodiment.

FIG. 6 is a drawing of an application example of the cylindrical part 20 according to the first embodiment. FIG. 6 illustrates a view of the inside of the circular cylinder of the gantry from the front side. The gantry cover 10a can be seen at the front. In the example illustrated in FIG. 6, the rail used by the couchtop 105a to move within the circular cylinder has been removed so as to expose a surface 11 on which the rail was installed.

In the example illustrated in FIG. 6, a surface 12 on inside of the circular cylinder corresponds to the innermost layer of the cylindrical part 20. In this situation, the surface 11 on the inside of the circular cylinder does not have the cylindrical part 20 provided thereon. The reason is because, when an image taking process is performed, the rail and the couchtop 105a are provided on the surface 11, and the sound propagated on the surface 11 is thus reduced sufficiently. For this reason, it is suggested that the cylindrical part 20 is provided in the position corresponding to the surface 12 where the rail and the couchtop 105a are not provided.

The Ring Part 30

Figure 7A:
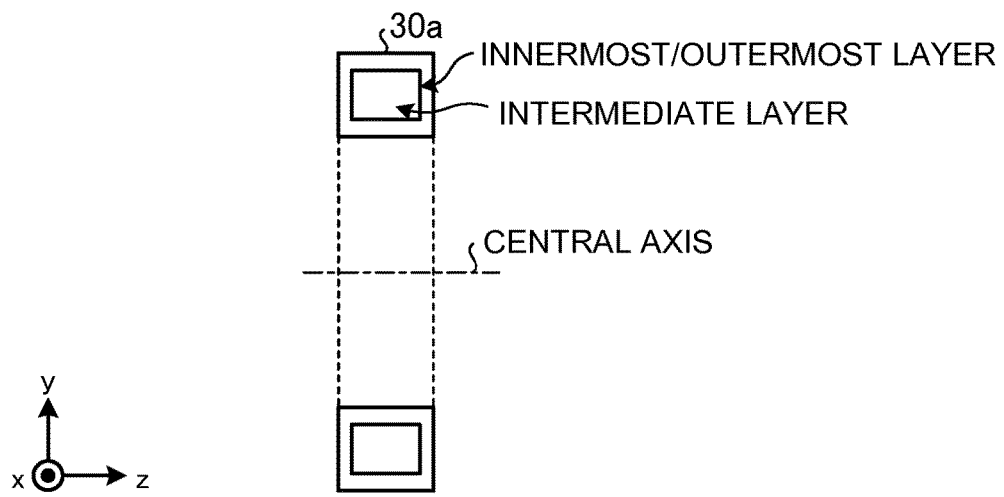
FIGS. 7A and 7B are drawings for explaining an exemplary structure of a ring part according to the first embodiment.
Figure 7B:
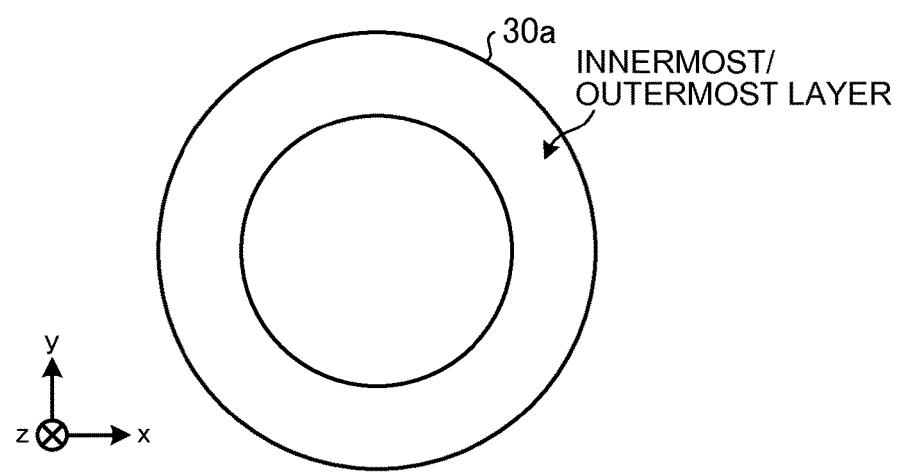

FIGS. 7A and 7B are drawings for explaining an exemplary structure of the ring part 30 according to the first embodiment. FIG. 7A illustrates a cross-sectional view of the ring part 30a on the y-z plane that passes through the central axis of the magnetostatic field magnet 101. FIG. 7B illustrates a view of the ring part 30a from the front side (the couch 105 side). The ring part 30b has the same structure as that of the ring part 30a. Thus, the explanation thereof will be omitted.

As illustrated in FIGS. 7A and 7B, for example, the ring part 30a has a sandwich structure configured with two layers that are namely an innermost/outermost layer and an intermediate layer. Of these layers, the innermost/outermost layer functions as both an outermost layer and an innermost layer and is configured as a layer made of a sound blocking material by using, for example, thermosetting resin containing glass such as GFRP. Further, the intermediate layer is configured as a layer made of a sound blocking material by using, for example, thermosetting resin, such as FRP, having a specific gravity different from that of the innermost/outermost layer. The ring part 30a is manufactured by performing an RTM molding on the intermediate layer with the innermost/outermost layer. By providing the two sound blocking layers having mutually-different specific gravities in this manner, it is possible to effectively block the sound generated by the gradient coil 103.

Next, the thickness of each of the layers will be explained. For example, in order to keep the thickness of the entirety of the ring part 30a small while maintaining a desired level of noise reduction capability, it is suggested that the thickness of the layer having the highest surface density be increased within the range permitted by the weight. For example, in the example illustrated in FIGS. 7A and 7B, it is suggested that the innermost/outermost layer be the thickest between the two layers. In contrast, in order to keep the weight of the entirety of the ring part 30a light while maintaining a desired level of noise reduction capability, it is suggested that the thickness of the lightest layer be increased within the range permitted by the thickness. For example, in the example illustrated in FIGS. 7A and 7B, it is suggested that the intermediate layer be the thickest between the two layers. Possible embodiments are not limited to these examples. It is possible to arbitrarily change the thickness of each of the layers within the range that allows the desired level of noise reduction capability to be maintained.

As explained above, the ring part 30a is configured so that the plurality of layers made of the sound blocking materials having mutually-different specific gravities are laminated, the layers each being a non-metallic layer. With this arrangement, the ring part 30a is able to, for example, prevent the sound generated by the gradient coil 103 from propagating to the inside of the circular cylinder.

The description with reference to FIGS. 7A and 7B is merely an example. For instance, the ring part 30a may be configured as illustrated in FIG. 8.

FIG. 8 is a drawing for explaining another exemplary structure of the ring part 30 according to the first embodiment. FIG. 8 illustrates a cross-sectional view of the ring part 30a on the y-z plane that passes through the central axis of the magnetostatic field magnet 101.

As illustrated in FIG. 8, the ring part 30a includes a plurality of layers such as an outermost layer, a first intermediate layer, a second intermediate layer, . . . , and an innermost layer. In this situation, it is desirable to configure the ring part 30a in such a manner that layers made of a sound blocking material and layers made of a sound absorbing material are laminated so as to alternate. In this situation, the sound blocking material may be, for example, thermosetting resin containing glass such as GFRP, thermosetting resin such as FRP, or the like. The sound absorbing material may be, for example, rubber sponge such as EPDM, rubber, sponge, or the like. The reason is that it is possible to realize even a higher level of noise reduction capability, by repeating the sound absorption and the sound blocking, the sound absorption being realized with the layers made of the sound absorbing material to absorb the sound that propagates while using the layers made of the sound blocking material as a medium, and the sound blocking being realized with the layers made of the sound blocking material to block the sound that has passed through the layers made of the sound absorbing material.

Possible embodiments are not limited to the examples described above. The ring part 30a does not necessarily have to be configured in such a manner that the layers made of the sound blocking material and the layers made of the sound absorbing material are laminated so as to alternate. For example, the ring part 30a may be configured so that, in one or more parts thereof, layers made of a sound blocking material are laminated successively or layers made of a sound absorbing material are laminated successively. In other words, the ring part 30a is configured so that at least one layer made of a sound absorbing material and at least one layer made of a sound blocking material are laminated.

Further, the ring part 30a includes, as the outermost layer, the non-metallic layer having a predetermined strength. For example, the ring part 30a includes, as the outermost layer, the non-metallic layer having a strength required to function as the gantry cover 10. With this arrangement, the outermost layer of the ring part 30a is able to serve also as the gantry cover 10.

Further, the ring part 30a does not necessarily have to include the layer made of a sound absorbing material. In other words, it is sufficient if the ring part 30a includes at least one layer made of a sound blocking material. For example, the ring part 30a may be configured with a layer made of GFRP, which is a sound blocking material. Further, in order to ensure the strength required to function as the gantry cover 10, it is desirable to configure the ring part 30a so as to include at least one layer made of thermosetting resin containing glass, as a layer made of a sound blocking material.

The connection between the layers in the ring part 30 according to the first embodiment is the same as the connection between the layers in the cylindrical part 20 illustrated in FIGS. 5A and 5B. In other words, the layers in the ring part 30 are connected to one another, as a result of either adhering or fastening together the layers included in the ring part 30. For example, the layers in the ring part 30 are connected to one another, as a result of mechanically fastening together the layers from the outermost layer to the innermost layer by using fastening component parts 22 such as bolts. Alternatively, for example, the layers in the ring part 30 are connected to one another, as a result of performing an RTM process on the intermediate layers (the first intermediate layer, the second intermediate layer, and so on) by using thermoplastic resin. In that situation, as the intermediate layers, it is possible to use any arbitrary material selected out of the following materials that are also mentioned above: thermosetting resin containing glass, thermoplastic resin, rubber sponge, rugger, sponge, and the like. It should be noted that, however, when resin (thermosetting resin containing glass or thermoplastic resin) is used to form the intermediate layers, it is desirable to use resin that is a different material from the thermoplastic resin used in the molding process (of the innermost/outermost layer), for the purpose of varying the specific gravities between the innermost/outermost layer and the intermediate layers.

Figure 9:
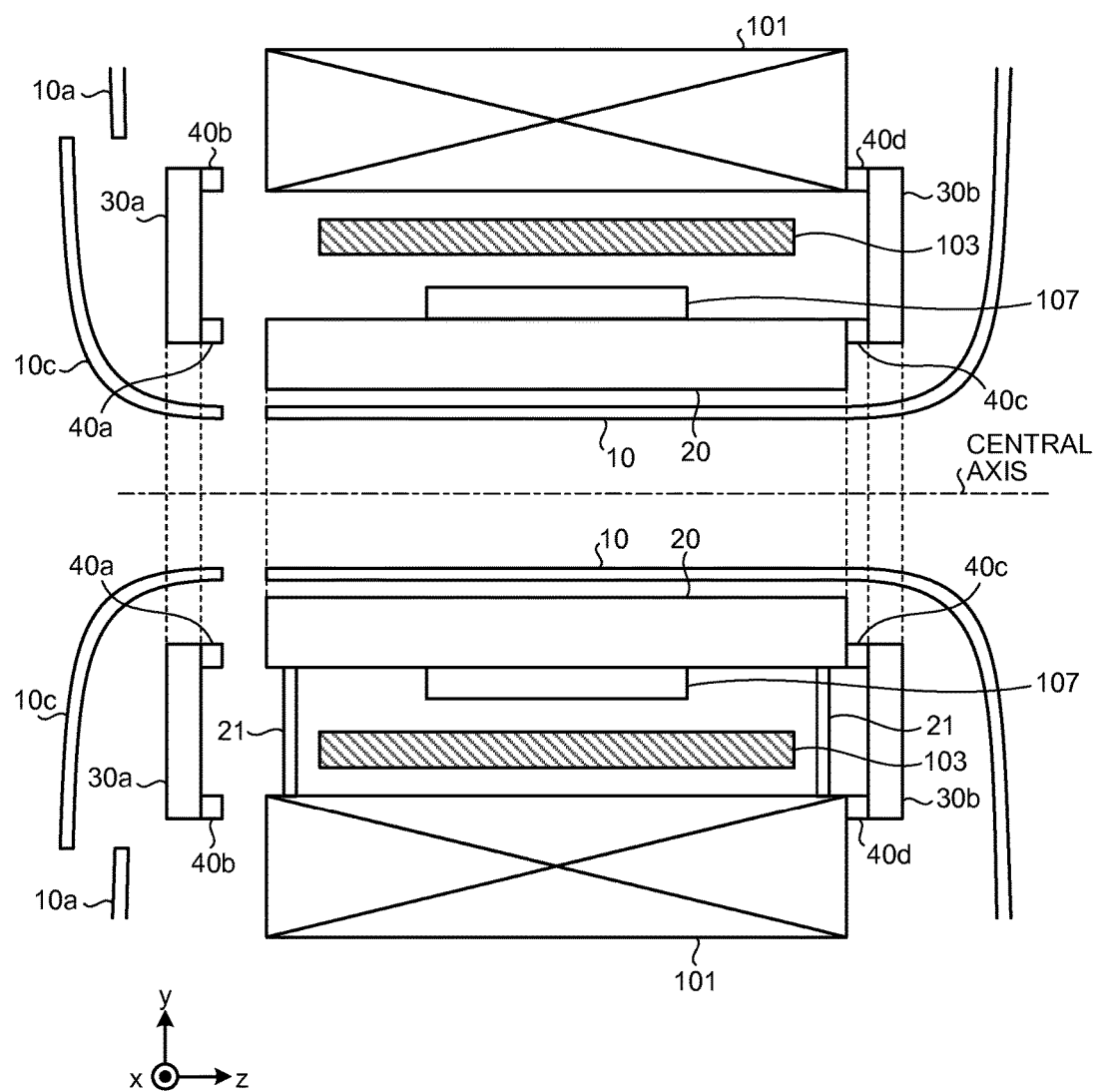
FIG. 9 is a drawing for explaining a positional relationship between the ring part and a magnet structure according to the first embodiment.

FIG. 9 is a drawing for explaining a positional relationship between the ring part 30 and the magnet structure according to the first embodiment. FIG. 9 illustrates a cross-sectional view on the y-z plane that passes through the central axis of the magnetostatic field magnet 101. FIG. 9 illustrates an example in which the gantry covers 10 covering the inside of the circular cylinder of the magnetostatic field magnet 101 are provided separately from the cylindrical part 20; however, the positional relationship is similarly applicable to the example illustrated in FIG. 2. Further, the magnetostatic field magnet 101, the gradient coil 103, and the cylindrical part 20 may collectively be referred to as a magnet structure. The ring part 30b has the same structure as that of the ring part 30a. Thus, the explanation thereof will be omitted.

As illustrated in FIG. 9, the ring part 30a is configured to cover the space formed between the magnetostatic field magnet 101 and the cylindrical part 20 on the end face of the magnetic structure. More specifically, the ring part 30a is in contact with the end face of the magnetostatic field magnet 101 and the end face of the cylindrical part 20 via sealing members 40a and 40b and has the minimum possible size for covering the end face of the gradient coil 103. Even more specifically, the inner circumference of the ring part 30a is positioned on the inside of the outer circumference of the cylindrical part 20, at a distance corresponding to the width of the sealing member 40a. Further, the outer circumference of the ring part 30a is positioned on the outside of the inner circumference of the magnetostatic field magnet 101, at a distance corresponding to the width of the sealing member 40a.

Further, the ring part 30a is detachably fixed to the end face of the magnetic structure, by using fixing units 33 (FIG. 11) explained later. Further, the ring part 30a is covered by a gantry cover 10c. The gantry cover 10c is formed to be substantially ring-shaped on the outside of the ring part 30a and has the minimum possible size for covering the ring part 30a.

The configuration illustrated in FIG. 9 is merely an example. For instance, the ring part 30a does not necessarily have to have the minimum possible size, as long as the ring part 30a is able to cover the end face of the gradient coil 103. Further, the gantry cover 10c does not necessarily have to have the minimum possible size, as long as the gantry cover 10c is able to cover the ring part 30a. Further, on the rear side of the gantry also, a partial gantry cover 10 that is similar to the gantry cover 10c and that has the minimum possible size for covering the ring part 30b may be provided.

Figure 10:
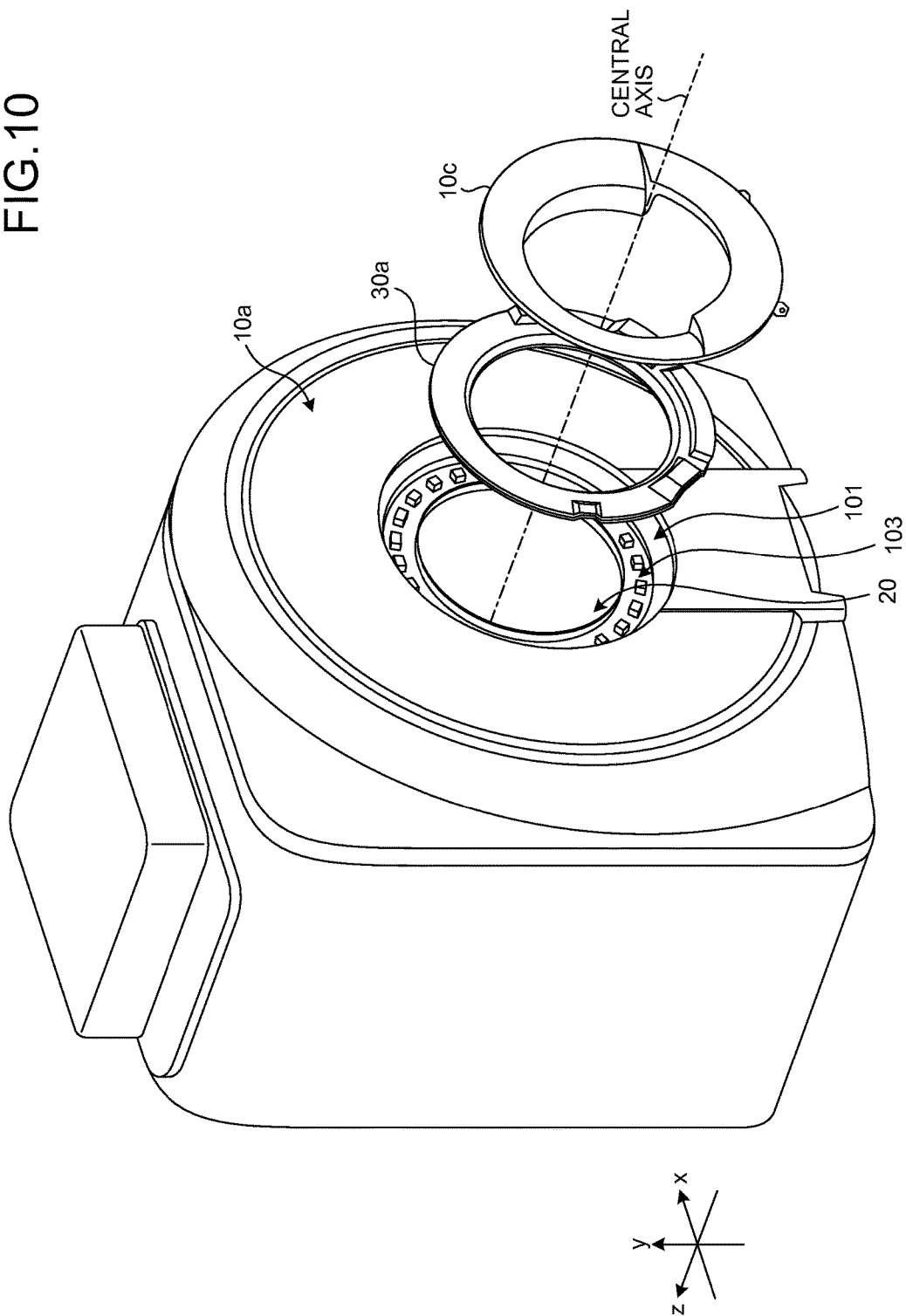
FIG. 10 is a drawing of an application example of the ring part according to the first embodiment.

FIG. 10 is a drawing of an application example of the ring part 30 according to the first embodiment. FIG. 10 illustrates a perspective view of the gantry, and the gantry cover 10a can be seen at the front. FIG. 10 illustrates an example in which the ring part 30a and the gantry cover 10c have been removed.

As illustrated in FIG. 10, for example, the gantry cover 10c has such a size so as to be able to cover the ring part 30a and the fixing units 33 (FIG. 11) configured to fix the ring part 30a. With this arrangement, a maintenance person who performs maintenance work on the MRI apparatus 100 is able to access the ring part 30a (i.e., approach close enough to perform the work), by only removing the gantry cover 10c.

Further, provided on the end face of the gradient coil 103 are a shim tray for storing iron shims therein, a cooling mechanism for cooling the gradient coil 103, and the like. Further, the end face of the gradient coil 103 is fixed by a fixation section that fixes the gradient coil 103. During a maintenance work, a maintenance person performs a maintenance work on the shim tray and the cooling mechanism by accessing the end face of the gradient coil 103 and attaches and detaches the gradient coil 103 by accessing the fixation section. In this situation, for example, the ring part 30a has such a size so as to be able to cover the end face of the gradient coil 103 and the fixation section. As a result, the maintenance person is able to perform a maintenance work on the shim tray and the cooling mechanism and to attach and detach the gradient coil 103, by only removing the ring part 30a.

Figure 11:
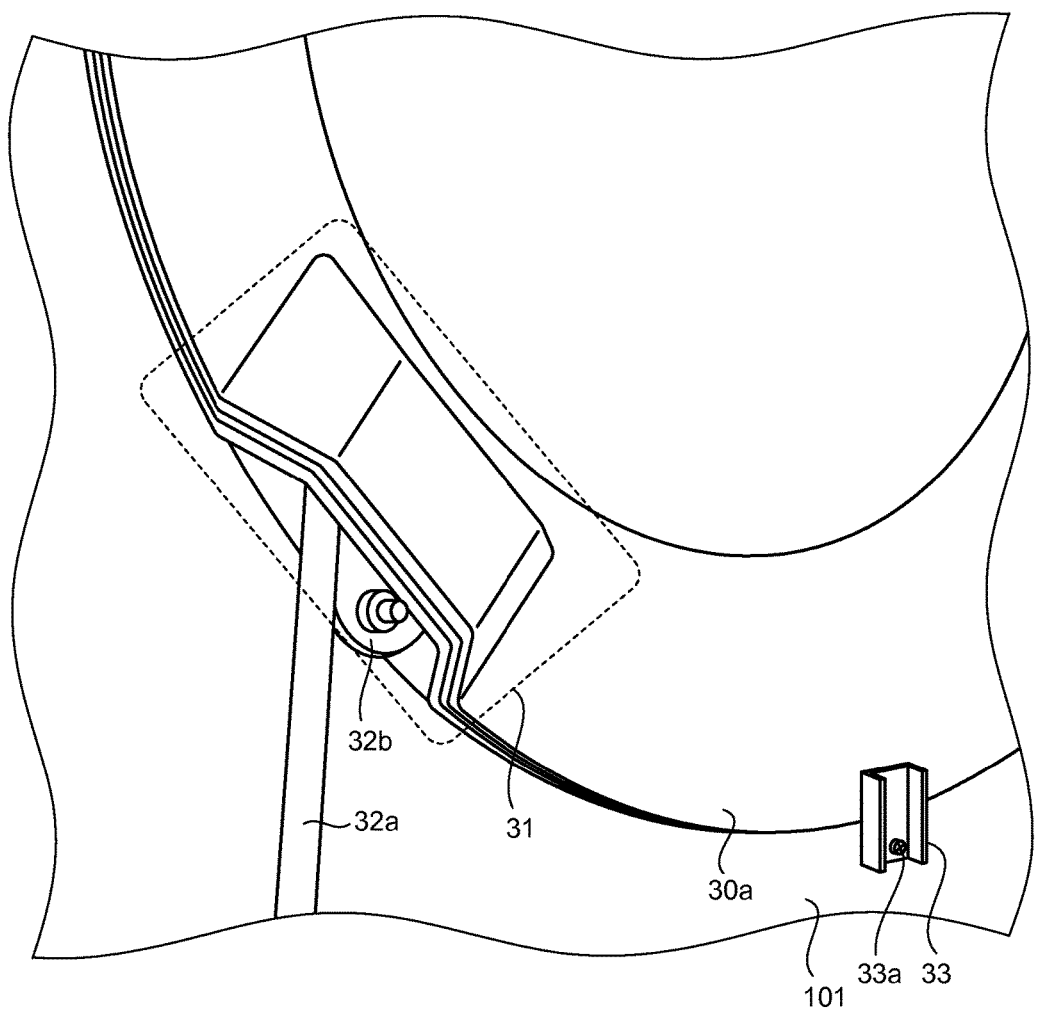
FIG. 11 is a drawing for explaining fixation of the ring part according to the first embodiment.

FIG. 11 is a drawing for explaining fixation of the ring part 30a according to the first embodiment. FIG. 11 illustrates an example in which the ring part 30a has been fixed to the end face of the magnet structure.

As indicated in a region 31 in FIG. 11, the ring part 30a is formed to have one or more recesses and projections conforming to the recess/projection structure provided on the end face of the gradient coil 103. For example, a cooling pipe 32a that is used for circulating a cooling medium and serves as a cooling mechanism and a fixation section 32b that fixes the gradient coil 103 are provided on the end face of the gradient coil 103. Thus, the ring part 30a is formed to have an elevated section illustrated in the region 31 so as to avoid the fixation section 32b and to allow the cooling pipe 32a to extend from the end face of the gradient coil 103 to the exterior.

Further, the ring part 30a is fixed to the magnetostatic field magnet 101 and the cylindrical part 20 by the fixing units 33 on the end face of the magnet structure. In the example illustrated in FIG. 11, the fixing units 33 are provided in multiple locations on the magnetostatic field magnet 101 side, so as to press down an outer circumferential part of the ring part 30a. Further, each of the fixing units 33 is provided so as to be rotatable on the x-y plane while using a supporting point 33a as the rotation center. For example, when each of the fixing units 33 is rotated to the left or the right by 90° from the state illustrated in FIG. 11, the fixing unit 33 comes off the outer circumferential part of the ring part 30a. With this configuration, the fixing units 33 allow the ring part 30a to be attached and detached. Each of the supporting points 33a is configured with, for example, a screw.

The Sealing Members 40

Figure 12A:
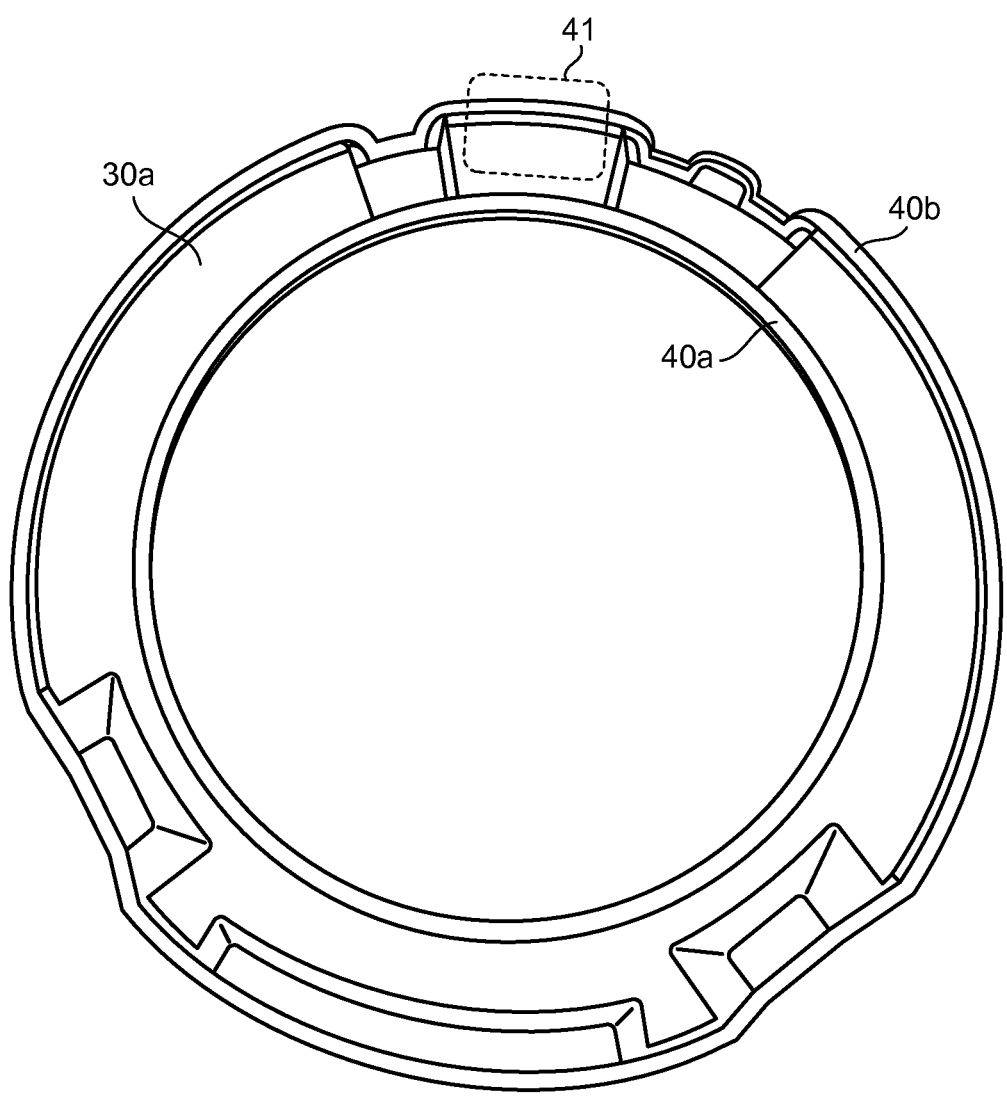
FIGS. 12A to 12C are drawings for explaining an exemplary structure of sealing members according to the first embodiment.
Figure 12B:
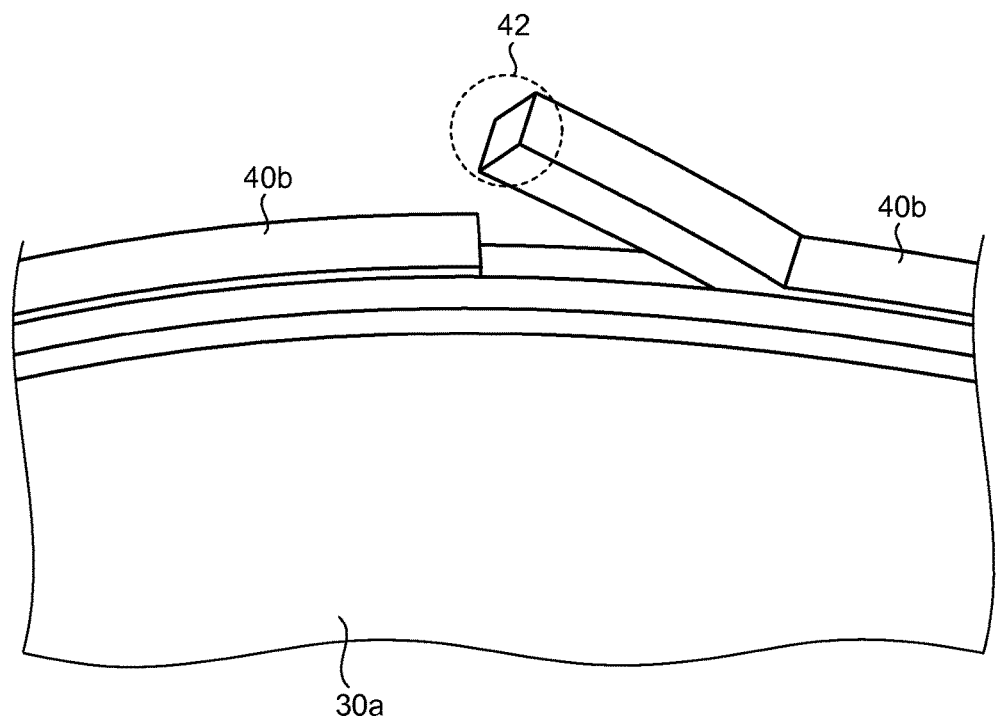
Figure 12C:
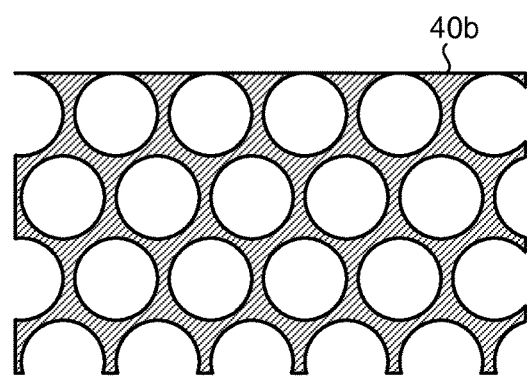

FIGS. 12A to 12C are drawings for explaining an exemplary structure of the sealing members 40 according to the first embodiment. FIG. 12A illustrates a view of the ring part 30a from the rear side (the side that is in contact with the magnet structure). FIG. 12B illustrates an enlarged view of a region 41 shown in FIG. 12A and is a drawing for explaining a cross-sectional shape of the sealing member 40b. FIG. 12C illustrates an enlarged view of a region 42 shown in FIG. 12B and is a drawing for explaining a structure of the sealing members 40.

As illustrated in FIG. 12A, the sealing members 40 are provided along each of the inner and the outer circumferences of the ring part 30 on such a plane that is in contact with the magnetostatic field magnet 101 and the cylindrical part 20. For example, the sealing members 40 are configured by using rubber sponge such as EPDM. The sealing member 40a is provided along the inner circumference of the ring part 30a, whereas the sealing member 40b is provided along the outer circumference of the ring part 30a.

In other words, the ring part 30 has the sealing member 40 provided along each of the inner and outer circumferences of the plane that is in contact with the end face of the magnet structure, so that the ring part 30 is attached to the magnet structure via the sealing members 40.

As illustrated in FIG. 12B, the cross section of the sealing member 40b is, for example, square. When the ring part 30a is fixed to the end face of the magnet structure by the fixing units 33, the sealing member 40b is deformed by the pressure that presses the sealing member 40b against the end face. Because the sealing member 40b has a resilient force (a repulsive force), the sealing member 40b is able to bring the ring part 30a and the magnetostatic field magnet 101 into close contact with each other and to bring the ring part 30a and the cylindrical part 20 into close contact with each other. In the following sections, the sealing member 40b will be explained. Because each of the other sealing members 40 has the same structure as that of the sealing member 40b, the explanation thereof will be omitted.

As illustrated in FIG. 12C, the sealing member 40b has closed-cell bubbles. The closed-cell bubbles are observed in a foam material in which the bubbles are individually present and are not connected (are non-contiguous) to one another. When being compressed, the material has appropriately low resilience and excellent flexibility due to repulsion of the independent bubbles and the expansion rate of the material forming the bubbles. As a result, the sealing member 40b is able to efficiently reduce the sound leaking through the gap between the magnet structure and the ring part 30a. For example, because the sealing member 40b has the closed-cell bubbles, the sealing member 40b is able to reduce the sound (the air-propagated sound) generated by the gradient coil 103. Further, to realize the appropriately low resilience, it is desirable if the sealing member 40b has density at the level of approximately 0.1 g/cm$^2$. The sealing member 40b is able to reduce the sound (the solid-propagated sound) that propagates while using the sealing member 40b itself as a medium.

Further, in the first embodiment, by using the sealing members 40, it is possible to prevent the sound generated by the gradient coil 103 from propagating to the inside of the cylindrical part 20 through a solid propagation. More specifically, the sound propagating through the solid propagation propagates to the inside of the cylindrical part 20 via one or more dampers (not shown) that support the gradient coil 103 on the magnetostatic field magnet 101. Even more specifically, the sound propagating through the solid propagation is generated by the gradient coil 103 and propagates via the parts that are in contact with each other that are namely the dampers, the magnetostatic field magnet 101, the ring part 30, and the cylindrical part 20, in the stated order.

Figure 13A:
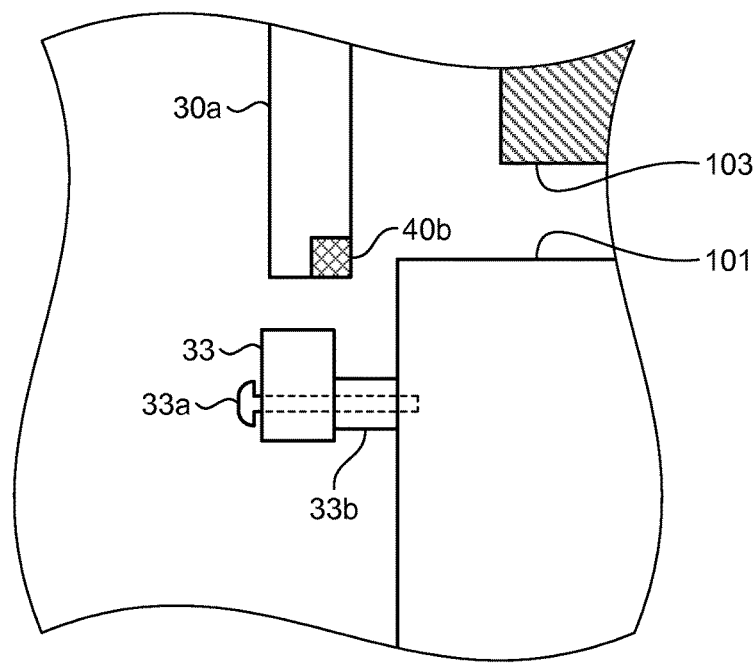
FIGS. 13A and 13B are drawings for explaining reduction of solid-propagated sound realized by a sealing member according to the first embodiment.
Figure 13B:
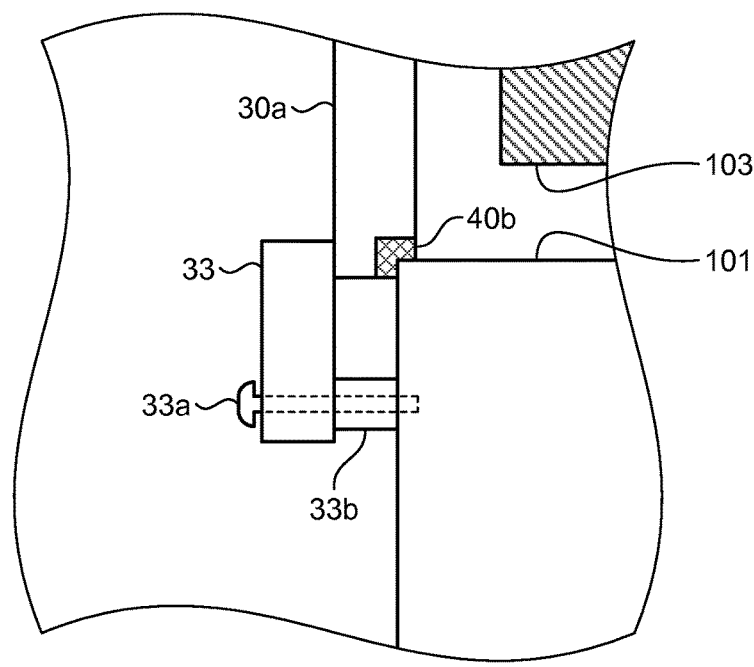

FIGS. 13A and 13B are drawings for explaining the reduction of the solid-propagated sound realized by a sealing member according to the first embodiment. FIG. 13A illustrates a situation before the ring part 30a having the sealing member 40b is attached to the magnet structure. FIG. 13B illustrates a situation after the ring part 30a having the sealing member 40b is attached to the magnet structure. FIGS. 13A and 13B each illustrate an enlarged view of the part where the ring part 30a is attached to the magnetostatic field magnet 101. As illustrated in FIG. 11, the fixing units 33 are rotatably attached to the magnet structure while using the predetermined points as the supporting points 33a. For example, when screws serving as the supporting points 33a are tightly fastened, the fixing units 33 are not able to rotate, but when the screws are loosened, the fixing units 33 are able to rotate. Further, the fixing units 33 are attached to the magnetostatic field magnet 101 while spacers 33b are interposed therebetween. Furthermore, the plurality of (two or more) fixing units 33 are arranged along the circumference of the magnetostatic field magnet 101.

As illustrated in FIG. 13A, when the ring part 30a is to be attached to the magnet structure, each of the fixing units 33 is positioned so that the longitudinal direction thereof extends along the circumferential direction of the magnetostatic field magnet 101. As a result, it is possible to attach the ring part 30a to the magnetostatic field magnet 101 and the cylindrical part 20 from the outside. After that, the person attaching the ring part 30a rotates each of the fixing units 33 by 90°, while the ring part 30a is pressed against the magnetostatic field magnet 101 and the cylindrical part 20, so that the longitudinal direction of each of the fixing units 33 becomes orthogonal to the circumferential direction. As a result, as illustrated in FIG. 13B, the ring part 30a is attached to the magnetostatic field magnet 101, while parts of the sealing member 40b are pressed and squished. At that time, the position of the ring part 30a is stabilized by being pressed against the fixing units 33, by the restoring force of such parts of the sealing member 40b that are pressed and squished. Although not shown in the drawing, also in the attachment part between the ring part 30a and the cylindrical part 20, the sealing member 40a is attached to the cylindrical part 20 while parts thereof are pressed and squished.

In this situation, the ring part 30a is fixed to the end face of the magnet structure in such a position where the sealing member 40b provided for the ring part 30a is not completely compressed. In other words, the sealing member 40b remains with some resilient force (resilience). In that situation, because the sealing member 40b has a small spring constant, it is possible to reduce vibrations having various frequencies. For this reason, the MRI apparatus 100 is able to reduce the solid-propagated sound generated by the gradient coil 103. More specifically, it is possible to reduce the solid-propagated sound at the stage where the solid-propagated sound propagates from the magnetostatic field magnet 101 to the ring part 30a and at the stage where the solid-propagated sound propagates from the ring part 30a to the cylindrical part 20.

Further, the fixing units 33 are rotatably attached to the magnet structure while using the predetermined points as the supporting points. As a result, a person who attaches and detaches the ring part 30 is able to easily perform the attachment and detachment of the ring part 30. For example, when three fixing units 33 are provided along the circumference of the magnetostatic field magnet 101, the person is able to attach and detach the ring part 30 by only changing the orientation of each of the three fixing units 33. As a result, the MRI apparatus 100 is able to realize enhanced ease of maintenance.

In the present example, the sealing members 40 are configured with a resilient material having resilience.

The sealing members 40 do not necessarily have to have closed-cell bubbles. For example, the sealing members 40 may have semi-closed-cell bubbles. The semi-closed-cell bubbles are observed in a foam material in which some closed-cell bubbles are connected (contiguous) to one another. Thus, semi-closed-cell bubbles are also able to efficiently reduce the sound leaking through the gap between the magnet structure and the ring part 30, similarly to closed-cell bubbles.

As explained above, by including the cylindrical part 20, the ring part 30, and the sealing members 40, the MRI apparatus 100 according to the first embodiment is able to reduce the sound generated by the gradient coil 103. For example, the cylindrical part 20 is able to efficiently reduce the sound that directly propagates from the gradient coil 103 to the inside of the circular cylinder. Further, for example, the ring part 30 is able to efficiently reduce the sound that propagates from the gradient coil 103 to the exterior, while avoiding the cylindrical part 20. Further, for example, the sealing members 40 are able to efficiently reduce the sound (diffracted sound) that propagates through the gap between the magnet structure and the ring part 30a.

Further, the MRI apparatus 100 according to the first embodiment is able to realize enhanced ease of maintenance. For example, compared to the conventional noise reduction technique using vacuum, the MRI apparatus 100 is able to realize enhanced ease of maintenance. More specifically, the conventional noise reduction technique makes the structure of the hermetically-sealed container complicated, in order to form the vacuum space. Further, because the hermetically-sealed container is required to have a strength withstanding the pressure difference between the vacuum and the atmosphere, the dimension and the thickness of the hermetically-sealed container are large. In contrast, the MRI apparatus 100 is able to realize the noise reduction without having to form a vacuum space. In addition, the MRI apparatus 100 is configured so that a maintenance person is able to access the gradient coil 103 by only sequentially removing the gantry cover 10c and the ring part 30a. For this reason, the MRI apparatus 100 is able to realize ease of maintenance that is enhanced compared to the conventional noise reduction technique using vacuum.

The exemplary embodiments described above are merely examples. Possible embodiments are not necessarily limited to the configurations described above. For example, another embodiment is possible in which a structure having a similar configuration to that of the cylindrical part 20 is provided between the magnetostatic field magnet 101 and the gradient coil 103.

Further, in the exemplary embodiments described above, the example is explained in which the cylindrical part 20 includes at least one layer made of a sound absorbing material and at least one layer made of a sound blocking material. However, possible embodiments are not limited to this example. For instance, it is sufficient if the cylindrical part 20 includes at least one selected from a layer made of a sound absorbing material and a layer made of a sound blocking material.

Further, in the exemplary embodiments described above, the example is explained in which the ring part 30 includes at least one layer made of a sound blocking material. However, possible embodiments are not limited to this example For instance, it is sufficient if the ring part 30 includes at least one selected from a layer made of a sound absorbing material and a layer made of a sound blocking material.

According to at least one aspect of the exemplary embodiments described above, it is possible to enhance the noise reduction capability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:

a magnetostatic field magnet formed in a shape of a substantially circular cylinder;

a gradient coil also formed in a shape of a substantially circular cylinder and concentrically disposed inside the magnetostatic field magnet;

a cylindrical part that is also formed in a shape of a substantially circular cylinder and disposed concentrically inside the gradient coil, said cylindrical part including a first structure of layered members, the first structure having at least one layer made of a sound absorbing material that absorbs sound and a layer made of a sound blocking material that blocks sound; and a ring part that is substantially ring-shaped, said ring part being configured to cover a space formed between the magnetostatic field magnet and the cylindrical part on at least one end face of the magnetostatic field magnet, said ring part including a second structure of layered members, the second structure having at least one layer made of the sound absorbing material and a layer made of the sound blocking material, the ring part including at least one of an outer circumferential part and an inner circumferential part:

the outer circumferential part being attached to an end face of the magnetostatic field magnet via a first sealing member, a distance between the outer circumferential part and the end face of the magnetostatic field magnet being shorter than a thickness of the first sealing member in an uncompressed state and longer than the thickness of the first sealing member in a fully compressed state; and the inner circumferential part being attached to an end face of the cylindrical part via a second sealing member, a distance between the inner circumferential part and the end face of the cylindrical part being shorter than a thickness of the second sealing member in an uncompressed state and longer than the thickness of the second sealing member in a fully compressed state.

2. The magnetic resonance imaging apparatus according to claim 1, wherein the ring part has a sealing member provided along each of inner and outer circumferences of a plane that is in contact with the end face of the magnetostatic field magnet, so that the ring part is attached to the magnetostatic field magnet via the sealing members.

3. The magnetic resonance imaging apparatus according to claim 2, wherein the sealing members are formed with either closed-cell bubbles or semi-closed-cell bubbles.

4. The magnetic resonance imaging apparatus according to claim 1, further comprising: a gantry cover that is substantially ring-shaped so as to have a diameter that is substantially equal to a diameter of the ring part.

5. The magnetic resonance imaging apparatus according to claim 1, wherein
the magnetostatic field magnet includes a fixing unit configured to fix the ring part on the end face of the magnetostatic field magnet, and
the fixing unit is rotatably attached to the magnetostatic field magnet while using a predetermined point as a supporting point.

6. The magnetic resonance imaging apparatus according to claim 1, wherein the ring part has a resilient member provided along each of inner and outer circumferences of a plane that is in contact with the end face of the magnetostatic field magnet, so that the ring part is attached to the magnetostatic field magnet via the resilient members.

7. The magnetic resonance imaging apparatus according to claim 1, wherein, when including multiple layers made of the sound blocking material, the cylindrical part includes a layer made of thermosetting resin as at least one of the multiple layers made of the sound blocking material.

8. The magnetic resonance imaging apparatus according to claim 1, wherein the cylindrical part includes a non-metallic layer having a predetermined strength, as an innermost layer.

9. The magnetic resonance imaging apparatus according to claim 1, wherein layers in the cylindrical part are connected to one another as a result of either adhering or fastening together the layers included in the cylindrical part.

10. The magnetic resonance imaging apparatus according to claim 1, wherein, when resin is shaped as the sound blocking material included in the cylindrical part, the resin is a different material from thermosetting resin used in a shaping process of the cylindrical part.

11. The magnetic resonance imaging apparatus according to claim 1, further comprising:
a second ring part that is substantially ring-shaped, that is configured to cover a space formed between the magnetostatic field magnet and the cylindrical part on at least one end face of the magnetostatic field magnet, said second ring part being formed in a shape of a substantially circular cylinder that includes at least one layer made of the sound blocking material.

12. The magnetic resonance imaging apparatus according to claim 11, further comprising: a fixing unit configured to fix the ring part to the magnetostatic field magnet and the cylindrical part on the end face.

13. The magnetic resonance imaging apparatus according to claim 11, wherein, when including multiple layers made of the sound blocking material, the ring part includes a layer made of thermosetting resin as at least one of the multiple layers made of the sound blocking material.

14. The magnetic resonance imaging apparatus according to claim 11, wherein the ring part includes a non-metallic layer having a predetermined strength, as an outermost layer.

15. The magnetic resonance imaging apparatus according to claim 11, further comprising: a ring-shaped gantry cover that is formed to be substantially ring-shaped on an outside of the ring part and that has a minimum possible size for covering the ring part.

16. The magnetic resonance imaging apparatus according to claim 11, wherein the ring part is formed to have one or more recesses and projections conforming to a recess/projection structure provided on the end face of the gradient coil.

17. The magnetic resonance imaging apparatus according to claim 11, wherein the ring part is formed by shaping thermosetting resin into one or more layers including at least one layer made of the sound absorbing material.

18. The magnetic resonance imaging apparatus according to claim 17, wherein, when resin is shaped as the sound blocking material included in the ring part, the resin is a different material from thermosetting resin used in a shaping process of the ring part.

19. The magnetic resonance imaging apparatus according to claim 1, wherein the ring part has a sealing member provided along each of inner and outer circumferences of a plane that is in contact with the magnetostatic field magnet and the cylindrical part.

* * * * *